(12) United States Patent
Bapat (10) Patent No.: US 8,378,871 B1
(45) Date of Patent: Feb. 19, 2013

(54) DATA DIRECTED SCRAMBLING TO IMPROVE SIGNAL-TO-NOISE RATIO

(75) Inventor: Sumant Bapat, San Jose, CA (US)

(73) Assignee: Audience, Inc., Mountain View, CA (US)

( * ) Notice: Subject to any disclaimer, the term of this patent is extended or adjusted under 35 U.S.C. 154(b) by 0 days.

(21) Appl. No.: 13/565,751

(22) Filed: Aug. 2, 2012

Related U.S. Application Data

(60) Provisional application No. 61/515,770, filed on Aug. 5, 2011.

(51) Int. Cl.
*H03M 1/66* (2006.01)
(52) U.S. Cl. .......................... 341/144; 341/143
(58) Field of Classification Search .................. 341/144, 341/143, 172, 150
See application file for complete search history.

(56) References Cited

U.S. PATENT DOCUMENTS 7,777,658 B2 * 8/2010 Nguyen et al. ................ 341/143

* cited by examiner

*Primary Examiner* — Joseph Lauture
(74) *Attorney, Agent, or Firm* — Carr & Ferrell LLP (57) ABSTRACT

Provided are methods and systems for performing binary data conversion in digital-to-analog converters (DACs) having sigma-delta modulators and involving data directed scrambling (DDS) algorithms to effectively shape the element mismatch errors to first-order shaped wideband noise. An example method may commence with receiving binary data, which comprises positive binary data and negative binary data. The method may further comprise converting, by a DDS unit, the binary data into binary thermometer code data. The conversion is performed by selectively assigning one or more logic ones in a data array from a current location of a positive (negative) pointer when positive (negative) binary data is received. A number of the one or more logic ones may be associated with the binary data. The method may further comprise circularly shifting the positive (negative) pointer to a new location within the array by the number of the one or more logic ones.

22 Claims, 11 Drawing Sheets

DATA DIRECTED SCRAMBLING TO IMPROVE SIGNAL-TO-NOISE RATIO

CROSS REFERENCES TO RELATED APPLICATIONS

This application claims the benefit of U.S. Provisional Patent Application No. 61/515,770, filed Aug. 5, 2011, which is hereby incorporated by reference in its entirety.

TECHNICAL FIELD

The application generally relates to binary data conversion and, more specifically, to the improvement of audio quality and enhancing signal-to-noise ratio by employing a data directed scrambling scheme to binary audio data in sigma-delta digital-to-analog convertors (DACs).

BACKGROUND

DACs are now widely used for performing audio data conversion from digital form into analog form. Many DACs utilize sigma-delta modulators for performing transformation of higher-resolution digital signals into lower-resolution digital signals before they feed to DACs so as to improve the quality of an audio signal. The sigma-delta modulators use error feedback loops, where the difference between the two signals is measured and used to improve the signal conversion. The low-resolution signal typically changes more quickly than the high-resolution signal, and it can be filtered to recover the high-resolution signal with little or no loss of fidelity.

In general, the DAC converts a digital number (e.g., an 8-bit digital number) representing some analog value (e.g., a specific volume magnitude) into that analog value by generating a particular voltage. Such conversions are typically not completely accurate, and imperfect matching (also known as mismatches) of levels may result in an imperfect transfer function of digital signals into analog signals. Mismatched analog components in the DACs may cause integral nonlinearity errors, which in turn may give rise to harmonic distortion and poor signal-to-noise ratio (SNR). If a particular application requires an output audio signal greater than 17-bit (i.e., SNR>105 dB), the analog components generally need to match to 17-bit accuracy. However, analog components typically cannot match to 17-bit accuracy due to variability amongst the elements (transistors, switches, capacitors, and so forth) that comprise the DACs and sigma-delta modulators. Even after using advanced layout techniques, the matching generally is at best approximately 10-11 dB, yielding a SNR of approximately 70 dB, which results in poor performance in many audio applications. In most commercial applications, a SNR of over 100 dB may be needed.

Various techniques have been proposed to attempt to minimize such noise under at least some operating conditions. One such techniques refers to a dynamic element matching (DEM) scheme, which is used to convert signal nonlinearity (i.e., mismatch errors) into spectrally shaped noise and may greatly improve the SNR. A DEM scheme typically uses a scrambler to dynamically select a group of elements for each digital input code such that over time, each element is equally used. Conventional DEM schemes utilize single-pointer scrambling, which causes a discontinuity when the data switches from positive to negative and vice versa. The switching discontinuity may result in an ineffective averaging of the mismatch error, and hence poor SNR.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Provided are methods and systems for performing binary data conversion. These methods and systems may be utilized in DACs having sigma-delta modulators and involve the use of data directed scrambling (DDS) algorithms to effectively shape the element mismatch errors to first-order shaped wideband noise. The DDS methods and systems use at least two pointers (a positive pointer and a negative pointer) for positive and negative binary data, respectively. In exemplary operation, the binary data is converted into a binary thermometer code by activating elements of a data array by shifting the positive pointer when the output of the sigma-delta modulator is positive, and by shifting the negative pointer when the sigma-delta modulator output is negative. Having at least two pointers, according to various embodiments, provides significantly more effective scrambling than methods and/or systems using only a single pointer. The methods and systems described herein may advantageously provide lower distortion and higher SNR DAC to improve audio signal quality in the DAC-to-headphone path, for example.

An example method for performing binary data conversion may commence with a receiver receiving binary data, which comprises positive binary data and negative binary data. The method may further comprise converting, by a data directed scrambling unit, the binary data into binary thermometer code data. The conversion is performed by selectively assigning one or more logic ones in a data array from a current location of a positive pointer, when positive binary data is received, or from a current location of a negative pointer, when negative binary data is received. A number of the one or more logic ones assigned in the data array can be associated with the binary data. In certain embodiments, the data directed scrambling unit includes the receiver.

In certain embodiments of the present disclosure, the binary thermometer code data can be outputted to a digital-to-analog converter. The binary thermometer code data can control behavior of the digital-to-analog converter. The positive pointer can be circularly shifted from the current location to a new location within the data array. The positive pointer can be shifted by the number of the one or more logic ones. Similarly, the negative pointer can be circularly shifted from the current location to a new location within the data array. The negative pointer can be also shifted by the number of the one or more logic ones.

In certain embodiments of the present disclosure, the data array may comprise a sign bit. The method may further comprise assigning the sign bit to zero when positive binary data is received. The method may further comprise assigning the sign bit to logic one when negative binary data is received. The binary data can be received from a sigma-delta modulator.

In certain embodiments of the present disclosure, a length of the binary thermometer code can be greater than a length of the binary data per clock cycle. The length of the binary thermometer code can be a 16-bit per clock cycle. The length of the binary data can be a 5 bit per operating cycle. The binary data can represent an audio data stream.

Also provided is a system for performing binary data conversion. In certain embodiments of the present disclosure, the system includes a receiver configured to receive binary data.

The binary data can comprise positive binary data and negative binary data. The system also include a data directed scrambling unit configured to convert the binary data into binary thermometer code data by selectively assigning one or more logic ones in a data array from a current location of a positive pointer when positive binary data is received, or from a current location of a negative pointer when negative binary data is received. A number of the one or more logic ones assigned in the data array can be associated with the binary data.

In certain embodiments of the present disclosure, the system may further comprise a digital sigma-delta modulator configured to modulate the binary data to a lower-resolution binary data. The data directed scrambling unit can be further configured to circularly shift the positive pointer from the current location to a new location within the data array. The positive pointer can be shifted by the number of the one or more logic ones. The data directed scrambling unit can be further configured to circularly shift the negative pointer from the current location to a new location within the data array. The negative pointer can be shifted by the number of the one or more logic ones.

In certain embodiments of the present disclosure, the system may further comprise a DAC. The system may further comprise a filter, with the filter can be configured to perform interpolation of the binary data.

Provided also is a non-transitory processor-readable medium. The medium can have program being executable by at least one processor to perform a method for performing binary data conversion. The method may comprise receiving binary data, with the binary data comprising positive binary data and negative binary data. The method may further comprise converting the binary data into binary thermometer code data by selectively assigning one or more logic ones in a data array from a current location of a positive pointer when positive binary data is received, or from a current location of a negative pointer when negative binary data is received. A number of the one or more logic ones assigned in the data array can be associated with the binary data.

Embodiments described herein may be practiced on any device that is configured to receive and/or provide audio such as, but not limited to, personal computers (PCs), tablet computers, mobile devices, cellular phones, phone handsets, headsets, media devices, and systems for teleconferencing applications.

Other example embodiments of the disclosure and aspects will become apparent from the following description taken in conjunction with the following drawings.

BRIEF DESCRIPTION OF THE DRAWINGS

Embodiments are illustrated by way of example and not limitation in the figures of the accompanying drawings, in which like references indicate similar elements.

DETAILED DESCRIPTION

Various aspects of the subject matter disclosed herein are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspects may be practiced without these specific details. In other instances, well-known structures and devices are shown in block diagram form in order to facilitate describing one or more aspects.

The techniques of the embodiments disclosed herein may be implemented using a variety of technologies. For example, the methods described herein may be implemented in software executing on a computer system or in hardware utilizing either a combination of processors or other specially designed application-specific integrated circuits (ASICs), programmable logic devices, or various combinations thereof. In particular, the methods described herein may be implemented by a series of processor-executable instructions residing on a storage medium such as a disk drive or a processor-readable medium.

The DDS method and system described herein may be used to advantageously reduce the negative effects of nonlinearity in any device that outputs sound. In an exemplary embodiment of the present disclosure, the technology discussed herein may be implemented in a communication device, including but not limited to a cellular phone, smart phone, landline phone, and so forth. The technology discussed herein may be implemented in a computer, such as a desktop computer, laptop computer and tablet computer, and also in phone handsets, headsets, media devices, and systems for teleconferencing applications.

Figure 1:
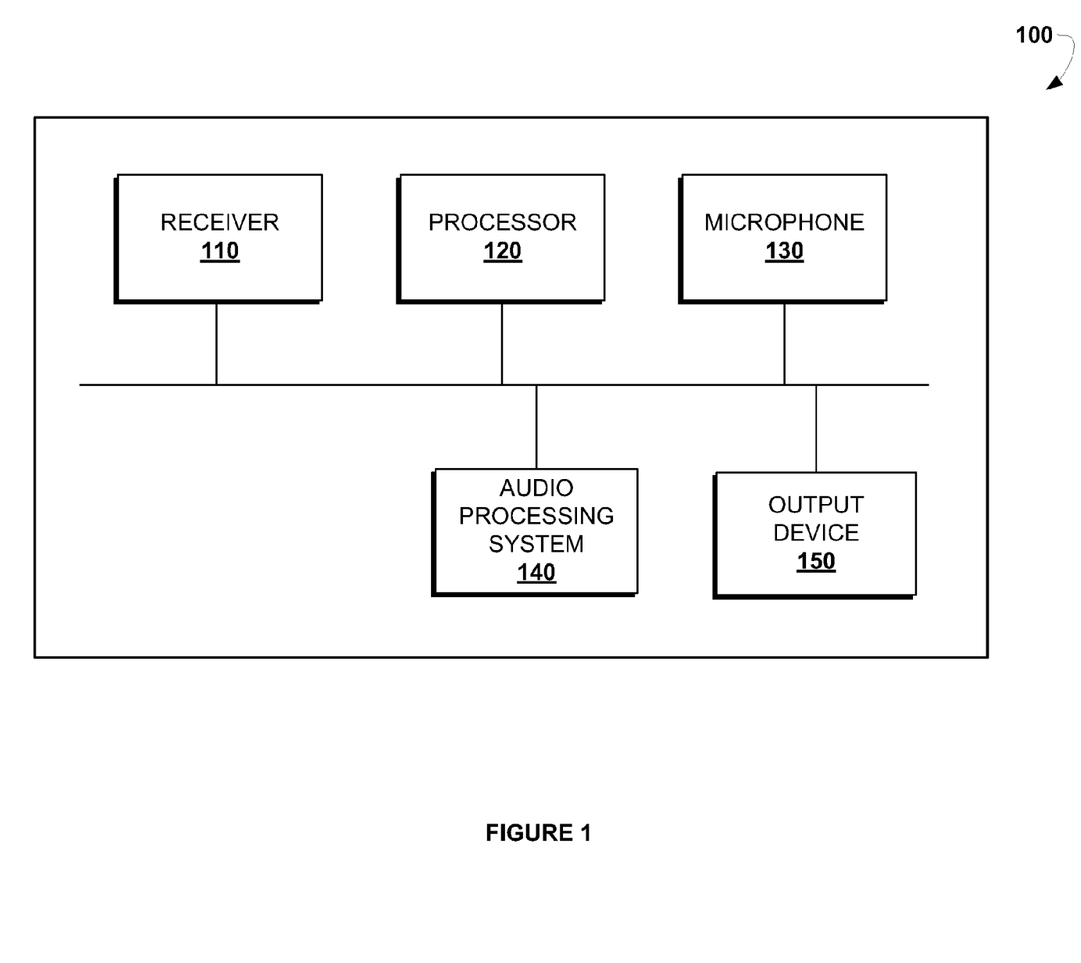
FIG. 1 shows an exemplary system suitable for implementing methods for data conversion.

Referring now to the drawings, FIG. 1 shows an exemplary system 100 suitable for implementing methods for data conversion as described herein. In an exemplary embodiment, the system 100 may comprise a receiver 110, a processor 120, a microphone 130, an audio processing system 140, and an output device 150. The system 100 may comprise more or other components to provide a particular operation or functionality. Similarly, the system 100 may comprise fewer components that perform similar or equivalent functions to those depicted in FIG. 1.

The receiver 110 can be configured to communicate with a network such as the Internet, Wide Area Network (WAN), Local Area Network (LAN), cellular network, and so forth, to receive audio data stream. The received audio data stream may be then forwarded to the audio processing system 140 and the output device 150.

The processor 120 may include hardware and software that implement the processing of audio data and various other operations depending on a type of the system 100 (e.g., communication device and computer).

The audio processing system 140 may include hardware and software that implement the conversion of audio data, according to various embodiments disclosed herein. In some exemplary embodiments, the audio processing system 140 may receive digital audio signals and convert them to analog signals using one or more DACs that utilize a DDS scheme using at least two pointers as described herein. The audio processing system 140 is further configured to receive acoustic signals from an acoustic source via microphone 130 (which may be one or more microphones or acoustic sensors) and process the acoustic signals. After reception by the microphone 130, the acoustic signals may be converted into electric signals by an analog-to-digital converter.

The output device 150 is any device which provides an audio output to a listener (e.g., the acoustic source). For example, the output device 150 may comprise a speaker, a class-D output, an earpiece of a headset, or a handset on the system 100.

Figure 2:
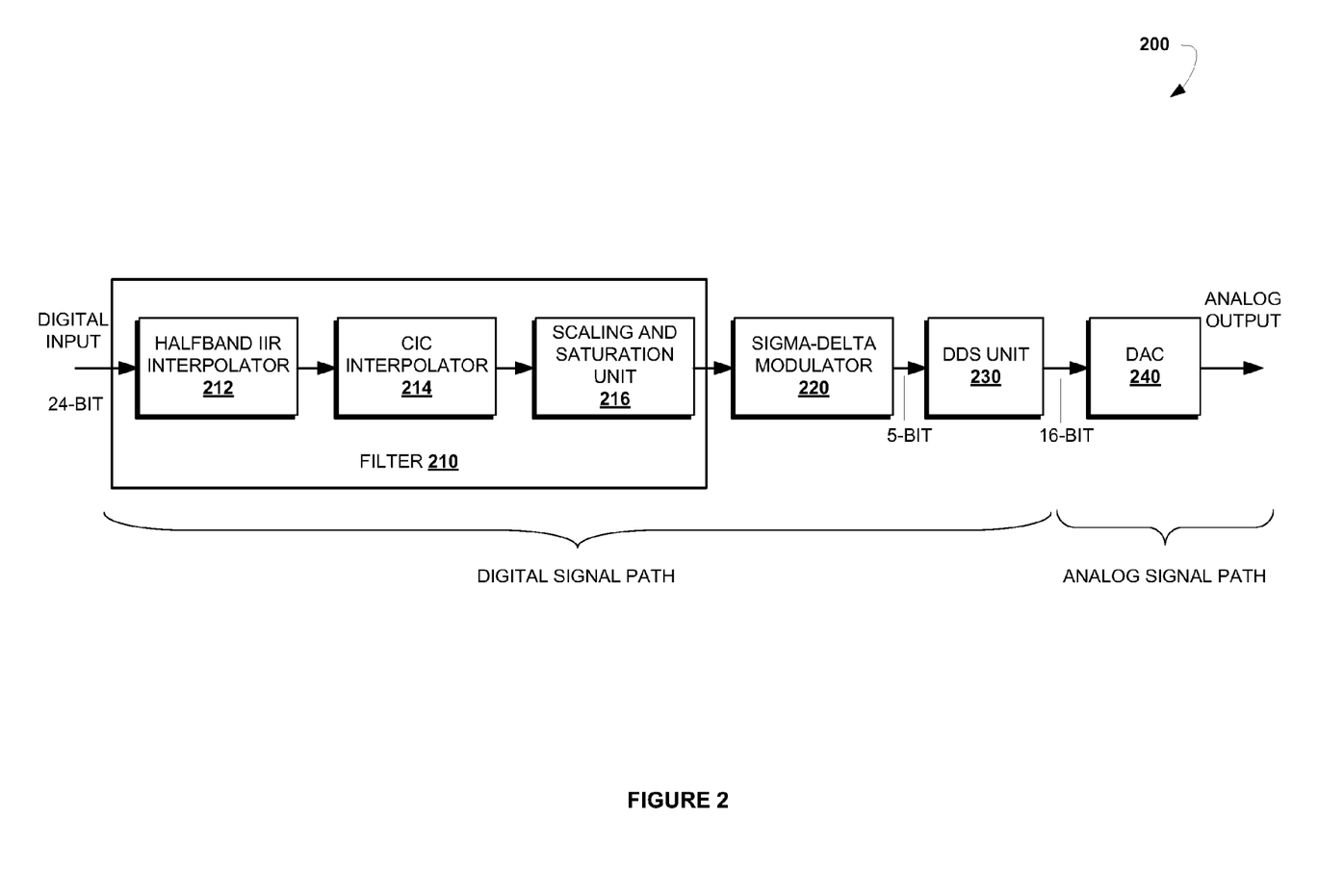
FIG. 2 is a block diagram of an exemplary data conversion system that utilizes DDS scheme having two pointers.

FIG. 2 is a block diagram of an exemplary data conversion system 200 that utilizes a DDS scheme having two pointers as described herein. In an exemplary embodiment, the data conversion system 200 may constitute or be a part of the audio processing system 140. In general, the data conversion system 200 is configured to convert digital audio signals into corresponding audio signals. As shown in this example, there are provided a digital signals path (including elements 210-230) and analog signals path (including element 240).

The data conversion system 200 comprises a filter 210 having one or more Infinite Impulse Response (IIR) filters configured to modify the input digital signal. In the example shown, the filter 210 includes a halfband IIR interpolator 212 and a Cascaded Integrator-Comb (CIC) interpolator 214. The filter 210 may further include a scaling and saturation unit 216.

The data conversion system 200 further comprises a sigma-delta (SD) modulator 220, DDS unit 230, and DAC 240. The SD modulator 220 may be configured to perform SD modulation against received filtered digital signal and output the modulated signal to DDS unit 230. The SD modulator 220 can transform higher-resolution digital signals into lower-resolution digital signals. For example, the input signal can be 24-bit signal, but the output signal can be just a 5-bit signal. The digital signal conversion can be performed using error feedback, where the difference between the two signals can be measured and used to improve the conversion.

Figure 3:
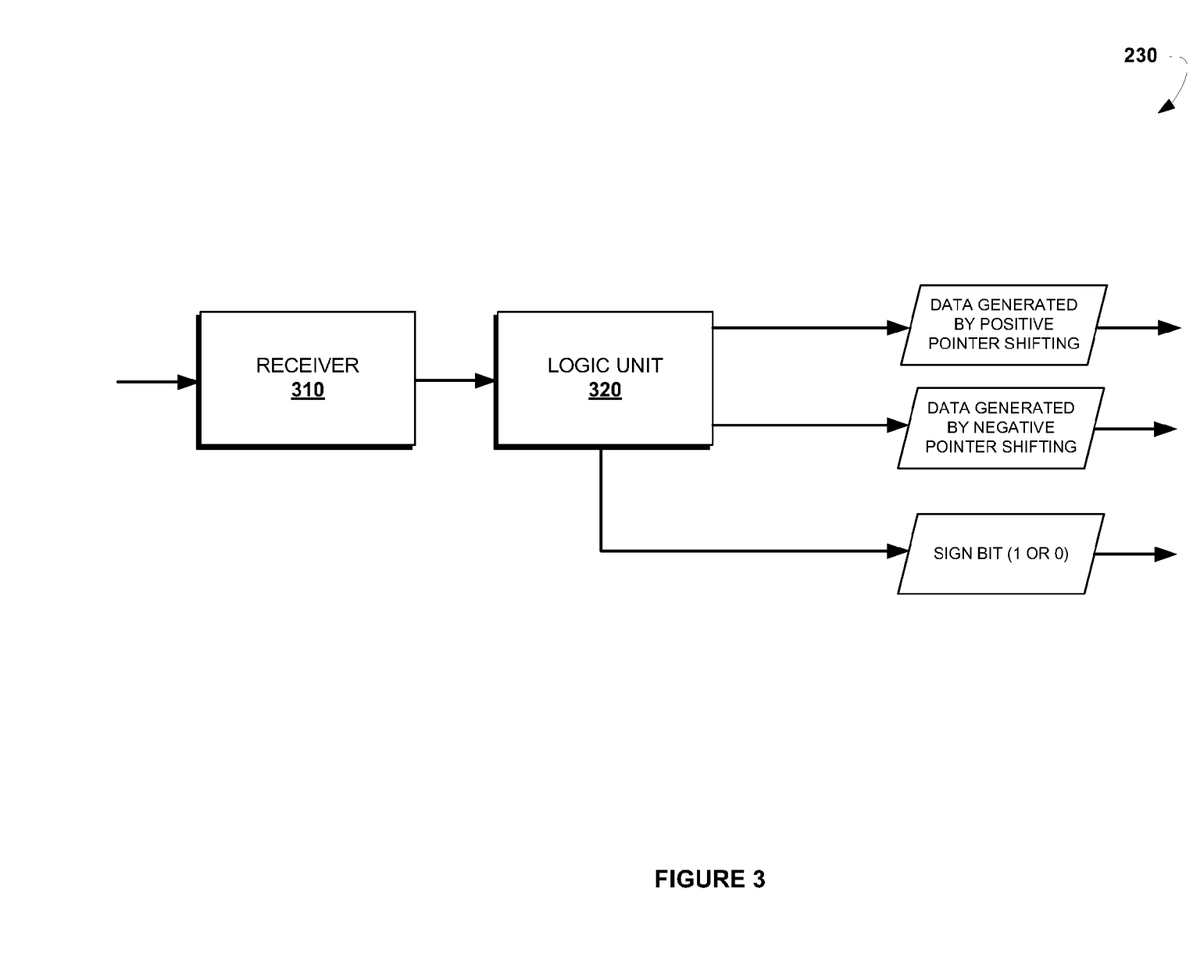
FIG. 3 shows a schematic representation of exemplary DDS unit.
Figure 4:
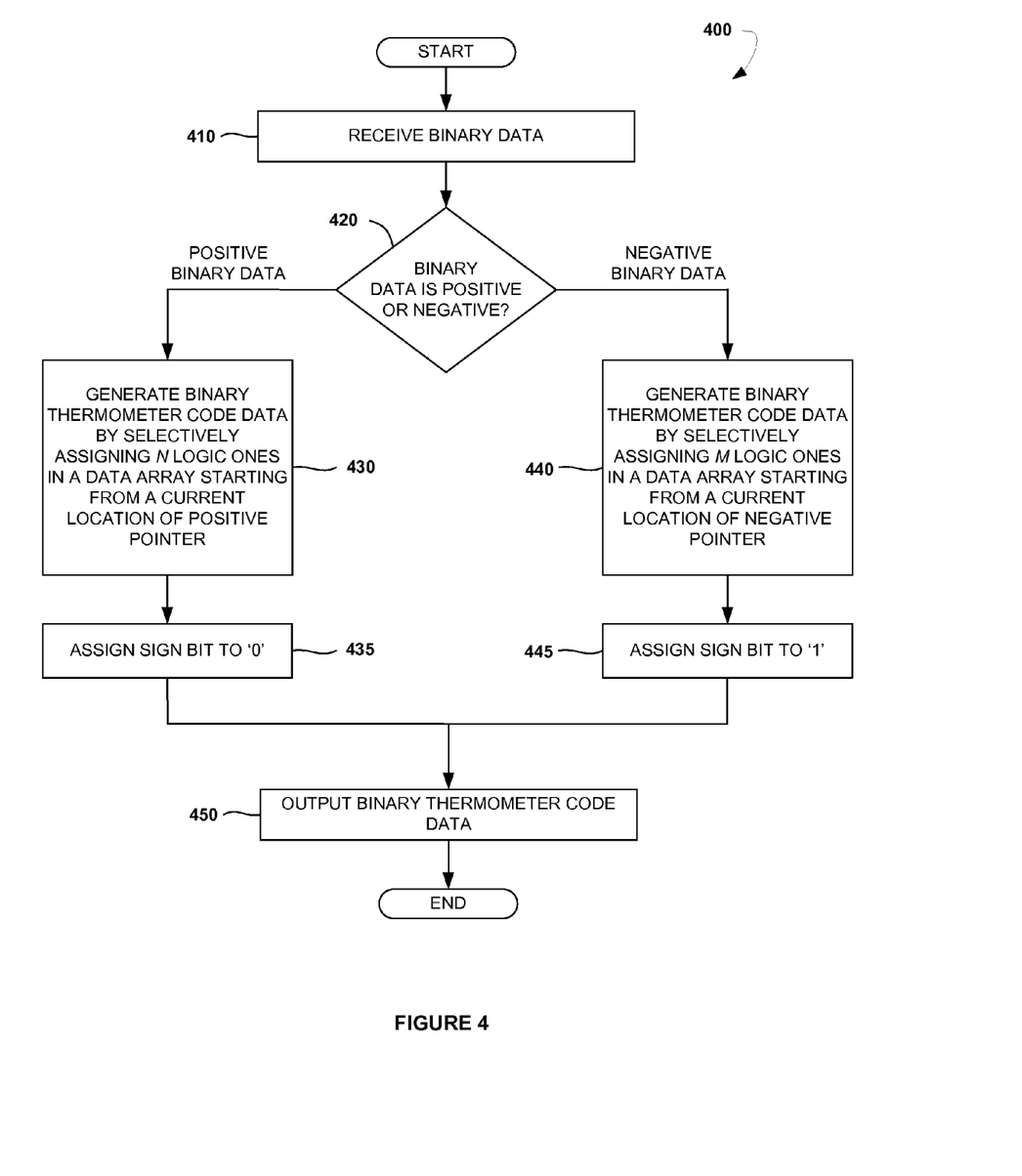
FIG. 4 is a flow chart of an example method for performing binary data conversion.

The DDS unit 230 is configured to perform digital data conversion by applying DDS algorithms as described herein with reference to FIGS. 3-5. These DDS algorithms use oversampling and noise shaping in a desired wideband such that SNR is increased. The result output may have an increased signal length (e.g., 16-bit signal).

The DAC 240 is configured to transform the received digital signal into an analog signal for further presenting to the appropriate output port (e.g., a class-D output port, a headphone output port, a speaker, or similar device). The DAC 240 may also include a reconstruction filter (not shown) to construct a smooth analog signal from a digital input signal.

It should be mentioned that the SD modulator 220 and DDS unit 230 can be integrated together or have functionality apportioned therebetween. Furthermore, the DAC 240 and DDS unit 230 may be integrated together. In yet another example embodiment, the SD modulator 220, DDS unit 230, and the DAC 240 can be implemented as a single unit.

FIG. 3 shows a schematic representation of exemplary DDS unit 230, according to various embodiments of the present disclosure. The DDS unit 230 may comprise a receiver 310 and a logic unit 320. The DDS unit 230 may further include additional modules, but the disclosure of such modules is omitted so as not to burden the entire description of the present teachings. It will be appreciated by one of ordinary skill in the art that examples of the foregoing modules may be virtual, and instructions to be executed by the modules may in fact be retrieved and executed by a processor. In some embodiments, the receiver 310 and/or logic unit 320 may be included in the SD modulator 220.

The receiver 310 may be configured to receive binary data to be converted using DDS algorithms. The binary data may comprise both positive binary data and negative binary data. In an exemplary embodiment of the present disclosure, the binary data can be provided in clock cycles such that in one clock cycle the received data is positive binary data, while in another clock cycle the received data is negative binary data.

The logic unit 320 can be configured to convert the binary data received by the receiver 310 into binary thermometer code data by using entropy encoding or other techniques such that a natural number represented by binary data received is transformed into one or more logic ones and one or more logic zeros. More specifically, the logic unit 320 selectively assigns one or more logic ones (e.g., in a successive manner) in a data array (e.g., a linear array) starting from a current location of a positive pointer, when positive binary data is received. The number of the one or more logic ones assigned in the data array is associated with or derived from the binary data received. In other words, when positive binary data is received, the positive pointer moves within the data array and activates a corresponding number of elements (activated elements represent logic ones).

Similarly, when negative binary data is received, the logic unit 320 selectively assigns one or more logic ones (e.g., in a successive manner) in the data array starting from a current location of a negative pointer. The number of the one or more logic ones assigned in the data array is associated with or derived from the binary data.

It should be mentioned that the data array is finite, and thus the positive and negative pointers can be looped. More specifically, the positive and negative pointers can be circularly shifted from the current location to a new location within the data array by the number of the one or more logic ones (as derived from the binary data received).

The logic unit 320 can be also configured to assign a value to a "sign" bit ('1' or '0') depending on a type of binary data. For example, when negative binary data is received, the logic unit 320 assigns the sign bit to '1.' Otherwise, when positive binary data is received, the logic unit 320 assigns to the sign bit the value of '0.'

The binary thermometer code data and the sign bit as generated by the logic unit 320 can be used to control behavior of the DAC 240. For these ends, the binary thermometer code data can be output by the logic unit 320 to the DAC 240.

FIG. 4 is a flow chart of an example method 400 for performing binary data conversion. The method 400 may be performed by processing logic that may include hardware (e.g., dedicated logic, programmable logic, microcode, etc.), software (such as run on a general-purpose computer system or a dedicated machine), or a combination of both. In one example embodiment, the processing logic resides at the audio processing system 140 and/or DDS unit 230.

The method 400 may commence at operation 410 with receiving binary data at a receiver 310. As explained above, the binary data can be either positive or negative binary data. At operation 420, the logic unit 320 determines whether the binary data is positive or negative.

If the binary data received is positive binary data, at operation 430, the logic unit 320 generates binary thermometer code data by selectively assigning N logic ones in a data array from a current location of a positive pointer. The number N of logic ones is associated with or derived from the binary data. At operation 435, if the binary data received is positive binary data, the logic unit 320 selectively assigns a sign bit to '0.'

Alternatively, if the binary data received is negative binary data, at operation 440, the logic unit 320 generates binary thermometer code data by selectively assigning M logic ones in a data array from a current location of a positive pointer. The number M of logic ones is associated with or derived from the binary data. At operation 445, if the binary data received is positive binary data, the logic unit 320 selectively assigns a sign bit to '1.'

It should be mentioned that the initial location of a positive or negative pointer may be at the first element of a data array. However, in operation, in every clock cycle, the pointers are shifted to new locations that are defined by the numbers N and M, accordingly. In cases where the number N or M is greater than a number of available elements in the data array starting from the current location of a positive or negative pointer, accordingly, to the end of the data array, the positive or negative pointer may need to make a loop (circular shift) to the beginning of the data array. These principles will be described with reference to an example given in FIGS. 5A-5D.

At operation 450, the logic unit 320 outputs the binary thermometer code data, which includes the data array with assigned one or more logic ones and sign bit, to the DAC 240 for further transformation into analog signals.

Note that operations 410-450 can be performed per clock cycle. In other words, upon completion of operation 450 at one clock cycle, operations 410-450 are repeated for the successive clock cycle.

Figure 5A:
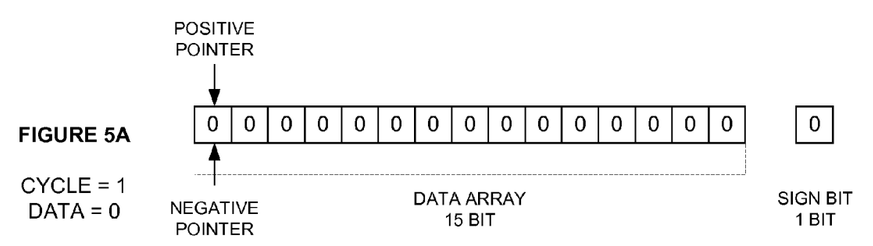
FIGS. 5A-5D illustrate exemplary operations of an embodiment of a method for performing binary data conversion.

FIGS. 5A-5D illustrate exemplary operations of an embodiment of method for performing binary data conversion. More specifically, there are shown example DDS processes performed by the DDS unit 230. As shown in FIG. 5A, in this exemplary embodiment, a 15 bit linear data array and a sign bit are provided. The linear data array is used to generate binary thermometer code data every clock cycle. The sign bit is used to indicate the sign of binary data received every clock cycle, with a '1' for negative and '0' for positive, or vice versa.

There are two pointers associated with the data array (i.e., a positive pointer and a negative pointer). As shown in FIG. 5A, both the positive pointer and the negative pointer can be initially set to the first element of the data array. Furthermore, all elements of the data array are initially set to '0.'

Figure 5B:
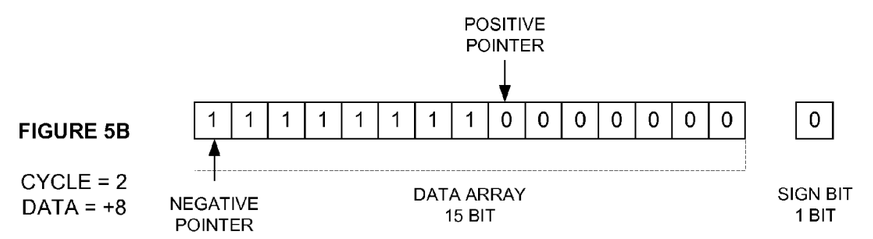

At the first clock cycle, as shown in FIG. 5B, when an input value of 8 is received, the positive pointer moves to the ninth bit location, and the first eight outputs in the thermometer code each become logic ones (instead of logic zeros), while the negative pointer remains at the first element location (since no negative inputs have been received).

Figure 5C:
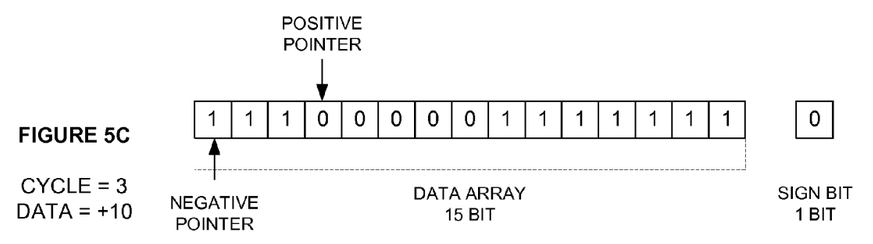

At the second clock cycle, as shown in FIG. 5C, assuming the next received data is 10, the data array values are set starting at the ninth bit, since the position of the positive pointer was set at this location during the first clock cycle as described with reference to FIG. 5B. The next seven outputs in the thermometer code become '1,' and the positive pointer loops to the first output bit, where the value is set to '1' for the first three output bits. The remaining bits may become '0' once the positive pointer is looped.

Figure 5D:
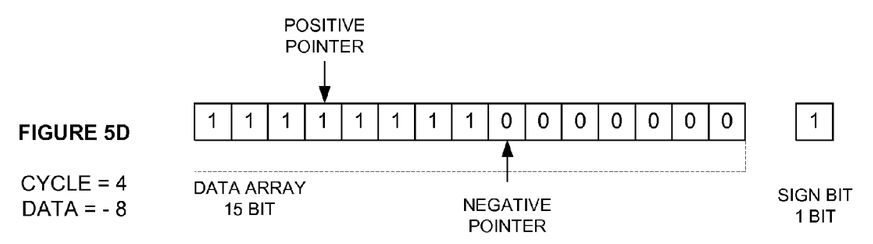

At the third clock cycle, as shown in FIG. 5D, assume the next received data is negative (e.g., −8). In this case, the number of bits indicated are changed to have a value of one, and the negative pointer is advanced to the indicated bit. For example, if the input is −8, then the first eight outputs in the thermometer coding are set to one. The negative pointer is then advanced to indicate the ninth bit value according to the illustrated exemplary operation. Moreover, when received data is negative, the sign bit is set to '1' for this clock cycle.

Figure 6:
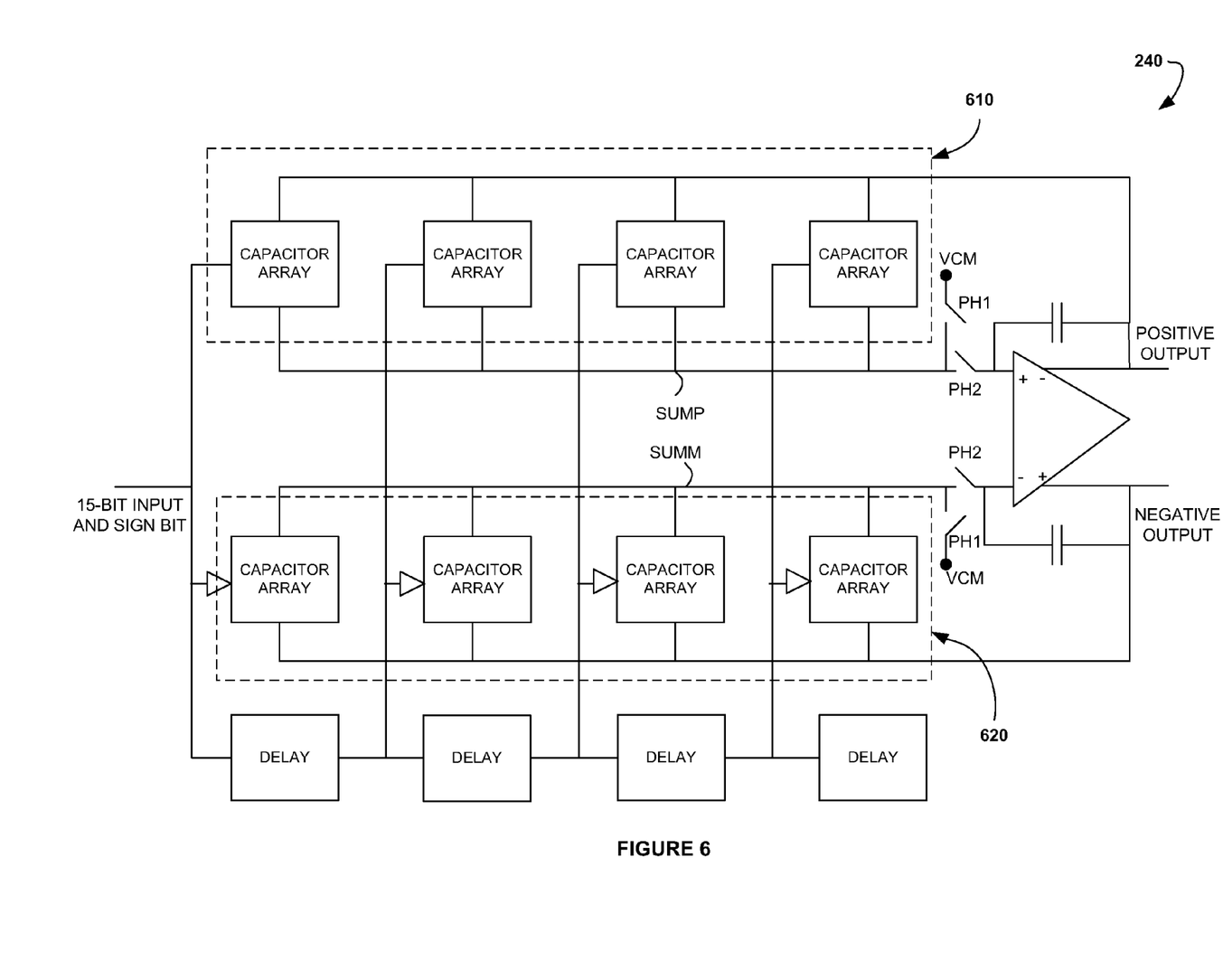
FIG. 6 illustrates an exemplary DAC, which may be used in the system that utilizes a DDS algorithm having two pointers.

FIG. 6 illustrates an exemplary DAC 240 that may be used in the system 200 that utilizes a DDS algorithm having two pointers. As shown in the figure, the DAC 240 may include two groups of capacitor arrays (i.e., a positive capacitor array group 610 with output SUMP and a negative capacitor array group 620 with output SUMM in this example). Those skilled in the art will appreciate that the positive capacitor arrays in group 610 may be used for the signals received from DDS unit 230 when the sign bit is set to '0,' and the negative capacitor arrays in group 620 may be used for the signals received from DDS unit 230 when the sign bit is set to '1.' Both capacitor arrays groups 610 and 620 may be used to convert the binary thermometer code data into analog signals based on the input from the DDS unit 230, clock signals, and a common mode voltage (VCM). In particular, the clock signals may control switches PH1 and PH2.

Figure 7A:
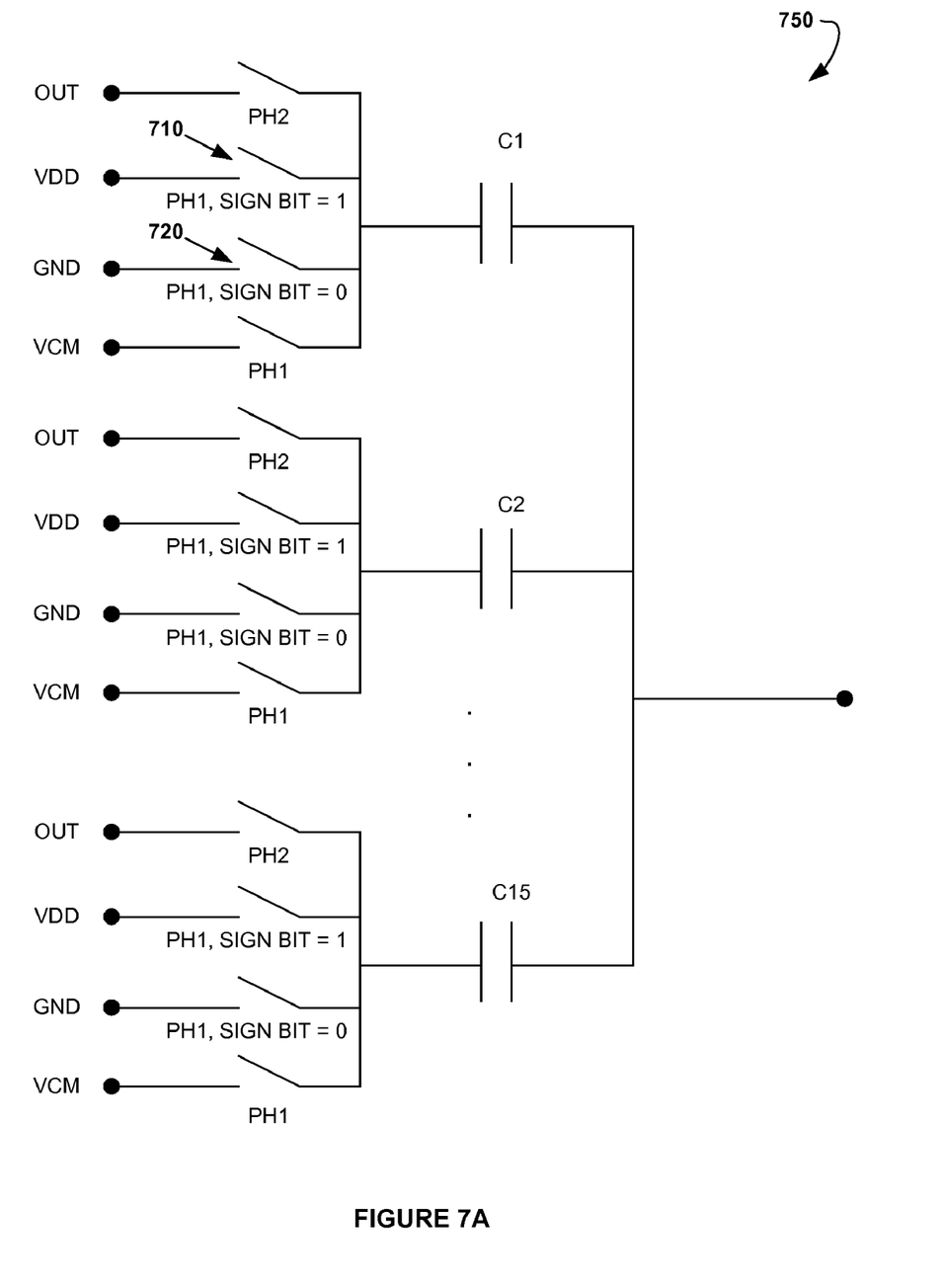
FIG. 7A shows an exemplary positive capacitor array used in an exemplary DAC.
Figure 7B:
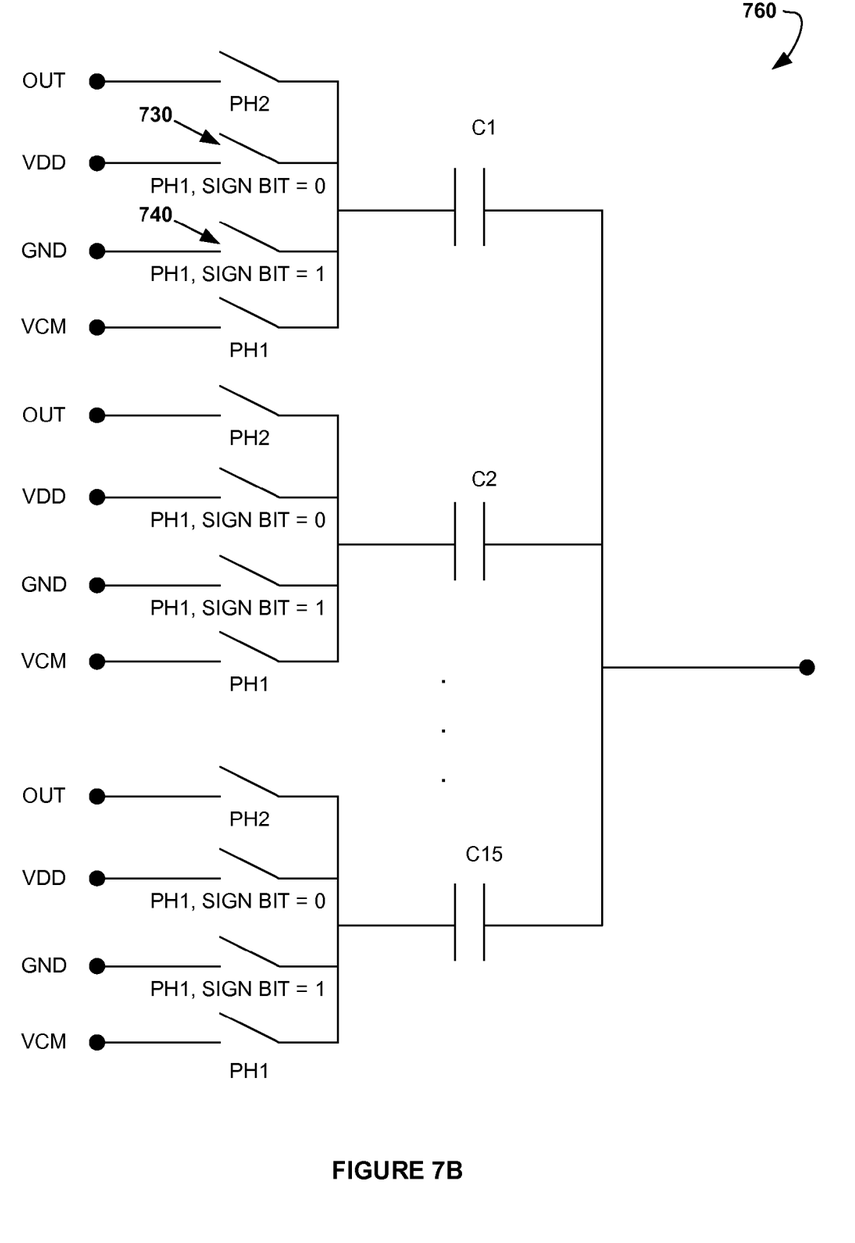
FIG. 7B shows an exemplary negative capacitor array used in an exemplary DAC.

FIG. 7A shows an exemplary positive capacitor array 750 (having fifteen capacitors, for example) of positive capacitor array group 610, and FIG. 7B shows an exemplary negative capacitor array 760 (having fifteen capacitors, for example) of negative capacitor array group 620, as used in the DAC 240. As shown in the figures, the overall structure of these capacitor arrays is similar. However, in positive capacitor arrays of group 610, as shown in FIG. 7A, a field-effect transistor (FET) switch 710 linked to a line "Vdd" (voltage drain-drain) is triggered when the sign bit is '1' and a FET switch 720 linked to a line "GND" (ground) is triggered when the sign bit is '0.' On the other hand, in the negative capacitor arrays of group 620, as shown in FIG. 7B, the FET switch 730 linked to the line "Vdd" is triggered when the sign bit is '0' and the FET switch 740 linked to the line "GND" is triggered when the sign bit is '1.' This approach allows selectively feeding signals from DDS unit 230 to the capacitors for accumulating and summing. As shown in the drawings, the analog signal generated by the capacitor arrays of groups 610 and 620 is a result of output of accumulated signal.

Figure 8:
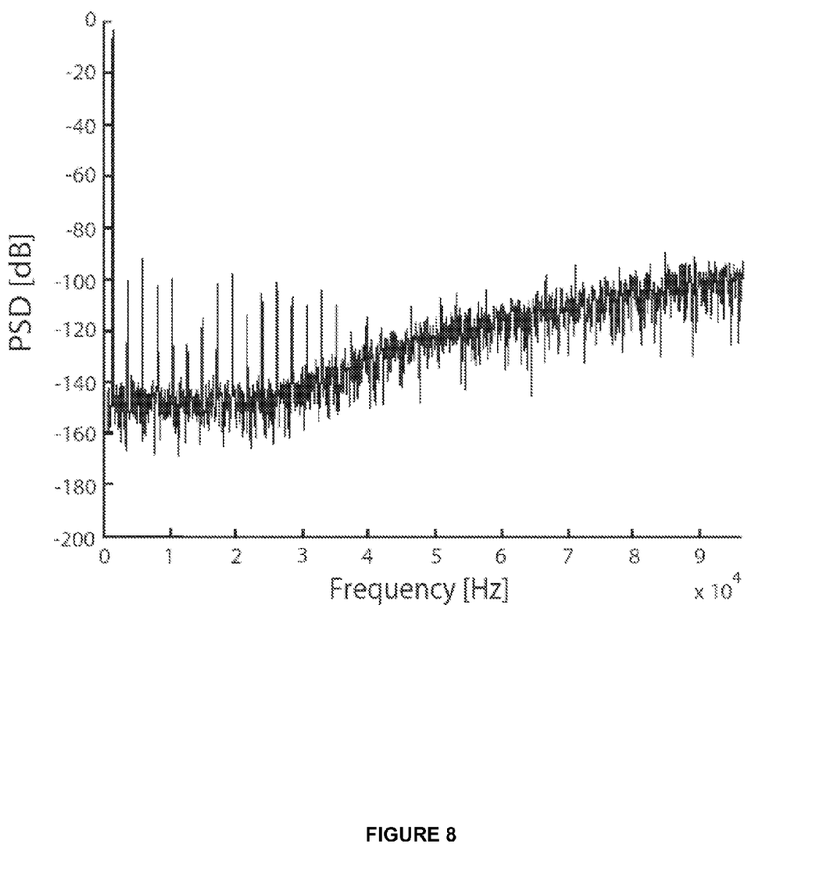
FIG. 8 shows an exemplary power spectrum density function of frequency for conventional DAC.
Figure 9:
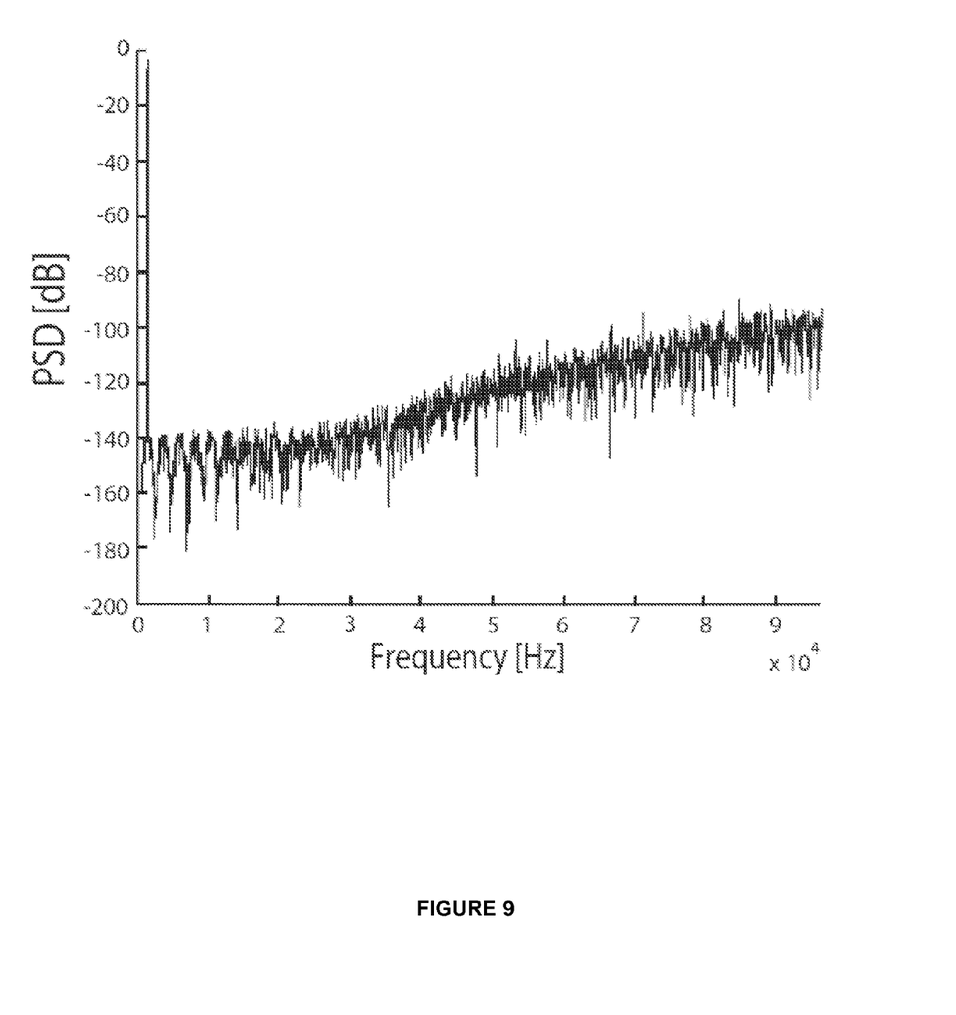
FIG. 9 shows an exemplary power spectrum density function of frequency for a DAC that uses a conventional DDS algorithm with a single pointer.
Figure 10:
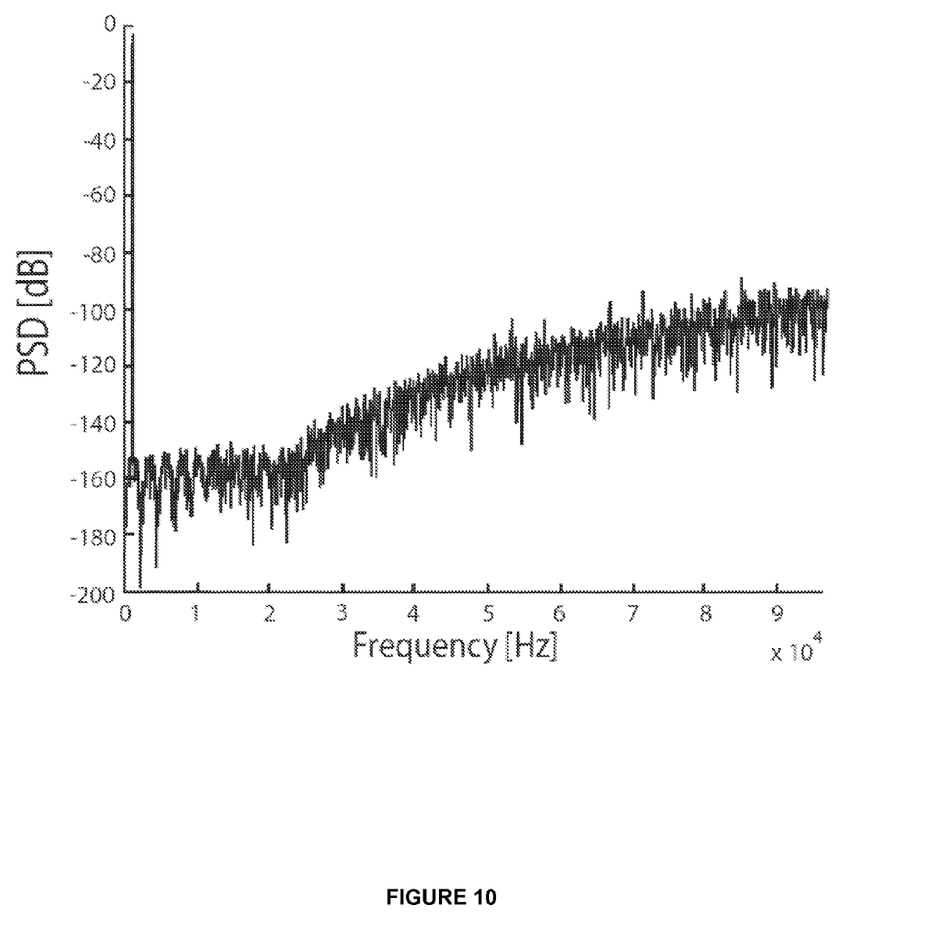
FIG. 10 shows an exemplary power spectrum density function of frequency for a DAC that uses a DDS algorithm with two pointers, according to one or more embodiments of the present disclosure.

The operation and advantageous effects of the DDS algorithms for performing binary data conversion as described herein are further illustrated by FIGS. 8-10. As was discussed earlier, the DDS algorithms enable effectively shaping noise that is distributed over the time or band so that the overall SNR is improved for the transformation of digital audio data stream into corresponding audio signals.

FIG. 8 shows an exemplary Power Spectrum Density (PSD) function of frequency for a DAC that does not use any technology for eliminating mismatch errors such as the DDS with two pointers as described herein. The PSD function shows the strength of the variations (i.e., energy) as a function of frequency. In other words, it shows at which frequencies the variations are strong and at which frequencies the variations are weak. Computation of the PSD function can be done directly by a Fast Fourier Transformation (FFT).

In the shown example, the DAC shows the harmonic distortion at lower frequencies resulting in a relatively low SNR. Namely, for the sampling shown in FIG. 8, a conventional DAC provided SNR=86 dB.

FIG. 9 shows an exemplary PSD function of frequency for a DAC that uses a conventional DDS algorithm with a single pointer. As seen in this figure, the harmonic distortion seen at lower frequencies in FIG. 8 was converted into white noise for an improved SNR. It was shown that the DAC output with process mismatch and the conventional DDS scheme provide improved SNR (SNR=114 dB) for the same sampling as used in the example shown in FIG. 8.

FIG. 10 shows an exemplary PSD function of frequency for a DAC that uses the DDS method with two pointers as described herein. Specifically, utilizing the DDS method according to various embodiments of the present disclosure yield even better results for the same sampling as was used in the examples shown in FIGS. 8 and 9, by causing the noise to have a first-order linear shape. It was demonstrated that the first-order-shaped noise is advantageous because as frequency rises, the noise increases beyond the audible threshold, thereby yielding a better SNR. For the shown example, the SNR was additionally increased up to SNR=130 dB.

It should be appreciated by those skilled in the art that in addition to having such 16 dB improvement in the SNR over conventional DDS algorithms, embodiments may have the additional benefit of reducing idle channel noise. In an exemplary embodiment, the reduction to idle channel noise may also be about 15 dB. Such a reduction may be highly advantageous, since idle channel noise can have a worse effect on audio quality than white noise, due to the sensitivity of human ears to tones buried even a few dB below the noise floor.

Thus, various methods and systems are provided for performing binary data conversion using DDS algorithms having the positive and negative pointers. While the present embodiments have been described in connection with a series of embodiments, these descriptions are not intended to limit the scope of the subject matter to the particular forms set forth herein. It will be further understood that the methods are not necessarily limited to the discrete components described. To the contrary, the present descriptions are intended to cover such alternatives, modifications, and equivalents as may be included within the spirit and scope of the subject matter as disclosed herein and defined by the appended claims and otherwise appreciated by one of ordinary skill in the art.

What is claimed is:

1. A method for performing binary data conversion, the method comprising:
  receiving binary data, the binary data comprising positive binary data and negative binary data;
  converting the binary data into binary thermometer code data by selectively assigning one or more logic ones in a data array from a current location of a positive pointer when positive binary data is received, or from a current location of a negative pointer when negative binary data is received; and
  wherein a number of the one or more logic ones assigned in the data array is associated with the binary data.

2. The method of claim 1, further comprising outputting the binary thermometer code data to a digital-to-analog converter (DAC).

3. The method of claim 2, wherein the binary thermometer code data controls behavior of the DAC.

4. The method of claim 1, further comprising circularly shifting the positive pointer from the current location to a new location within the data array, wherein the positive pointer is shifted by the number of the one or more logic ones.

5. The method of claim 1, further comprising circularly shifting the negative pointer from the current location to a new location within the data array, wherein the negative pointer is shifted by the number of the one or more logic ones.

6. The method of claim 1, wherein the data array comprises a sign bit.

7. The method of claim 6, further comprising assigning the sign bit to zero, when positive binary data is received.

8. The method of claim 6, further comprising assigning the sign bit to logic one, when negative binary data is received.

9. The method of claim 1, wherein the binary data is received from a sigma-delta modulator.

10. The method of claim 1, wherein a length of the binary thermometer code is greater than a length of the binary data per clock cycle.

11. The method of claim 10, wherein the length of the binary thermometer code is 16-bit per clock cycle.

12. The method of claim 10, wherein the length of the binary data is 5 bit per operating cycle.

13. The method of claim 1, wherein the binary data represents an audio data stream.

14. A system for performing binary data conversion, the system comprising:
  a receiver configured to receive binary data, the binary data comprising positive binary data and negative binary data;
  a data directed scrambling unit configured to convert the binary data into binary thermometer code data by selectively assigning one or more logic ones in a data array from a current location of a positive pointer when positive binary data is received, or from a current location of a negative pointer when negative binary data is received; and
  wherein a number of the one or more logic ones assigned in the data array is associated with the binary data.

15. The system of claim 14, wherein the data directed scrambling unit includes the receiver.

16. The system of claim 14, further comprising a digital sigma-delta modulator configured to modulate higher resolution binary data to a lower-resolution binary data to provide as the binary data to the receiver.

17. The system of claim 16, wherein the digital sigma-delta modulator includes the receiver and the data directed scrambling unit.

18. The system of claim 14, wherein the data directed scrambling unit is configured to circularly shift the positive pointer from the current location to a new location within the data array, wherein the positive pointer is shifted by the number of the one or more logic ones.

19. The system of claim 14, wherein the data directed scrambling unit is further configured to circularly shift the negative pointer from the current location to a new location within the data array, wherein the negative pointer is shifted by the number of the one or more logic ones.

20. The system of claim 14, further comprising a digital-to-analog converter (DAC).

21. The system of claim 14, further comprising a filter, wherein the filter is configured to perform interpolation of the binary data.

22. A non-transitory processor-readable medium having embodied thereon a program being executable by at least one processor to perform a method for performing binary data conversion, the method comprising:
  receiving binary data, the binary data comprising positive binary data and negative binary data;
  converting the binary data into binary thermometer code data by selectively assigning one or more logic ones in a data array from a current location of a positive pointer when positive binary data is received, or from a current location of a negative pointer when negative binary data is received; and
  wherein a number of the one or more logic ones assigned in the data array is associated with the binary data.

* * * * *